United States Patent
Sato et al.

(10) Patent No.: US 7,198,886 B2
(45) Date of Patent: Apr. 3, 2007

(54) METHOD FOR FORMING PATTERN

(75) Inventors: Yasuhiko Sato, Yokohama (JP); Tsuyoshi Shibata, Yokohama (JP); Junko Ohuchi, Yokohama (JP); Yasunobu Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/138,216

(22) Filed: May 27, 2005

(65) Prior Publication Data

US 2005/0233255 A1   Oct. 20, 2005

Related U.S. Application Data

(63) Continuation of application No. 09/957,512, filed on Sep. 21, 2001, now abandoned.

(30) Foreign Application Priority Data

Sep. 27, 2000 (JP) ............................. 2000-295240

(51) Int. Cl.
*G03F 7/30* (2006.01)
(52) U.S. Cl. ...................... 430/323; 430/157; 430/166; 430/270.1; 430/313; 430/316; 430/317; 430/330
(58) Field of Classification Search ................ 430/323, 430/330, 157, 166, 270.1, 313, 316, 317, 430/326
See application file for complete search history.

(56) References Cited

U.S. PATENT DOCUMENTS

| | | | | |
|---|---|---|---|---|
| 6,025,117 A | * | 2/2000 | Nakano et al. | ............. 430/314 |
| 6,270,948 B1 | | 8/2001 | Sato et al. | |
| 6,497,996 B1 | | 12/2002 | Naya et al. | |

FOREIGN PATENT DOCUMENTS

| JP | 63-77050 | 4/1988 |
|---|---|---|
| JP | 4-6563 | 1/1992 |

* cited by examiner

*Primary Examiner*—John S. Chu
(74) *Attorney, Agent, or Firm*—Finnegan, Henderson, Farabow, Garrett & Dunner, L.L.P.

(57) ABSTRACT

A method of forming a pattern, which comprises forming a masking material layer on a surface of a working film by coating the surface with a solution of a mixture comprising an inorganic compound having a bond between an inorganic element and oxygen atom, and a volatile unit, volatilizing the volatile unit to thereby make the masking material layer porous, forming a resist layer on a surface of the masking material layer, patterning the resist film to form a resist pattern, dry-etching the masking material layer to thereby transfer the resist pattern to the masking material layer, thereby forming a masking material pattern, and dry etching the working film to thereby transfer the masking material pattern to the working film to thereby form a working film pattern.

11 Claims, 2 Drawing Sheets

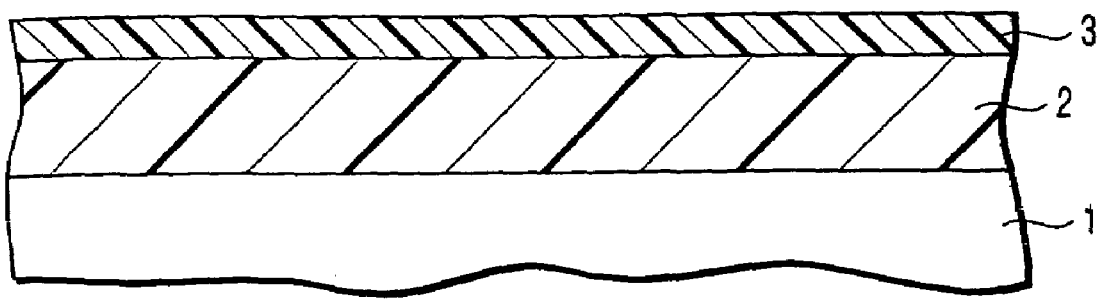
F I G. 1A
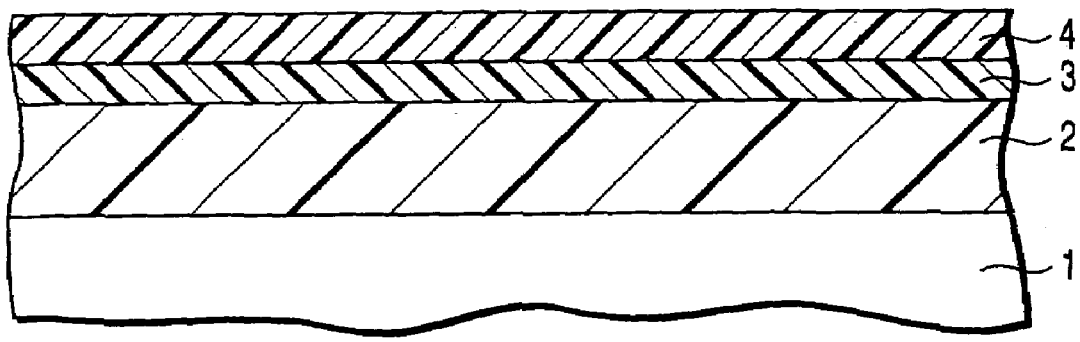
F I G. 1B
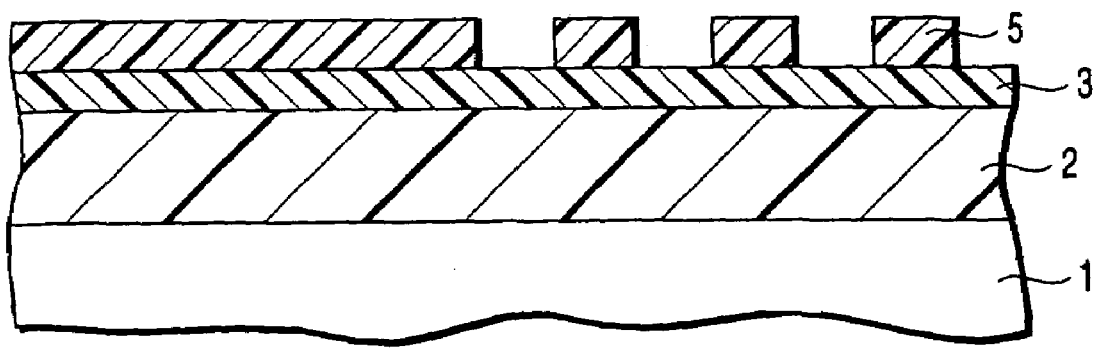
F I G. 1C

METHOD FOR FORMING PATTERN

CROSS-REFERENCE TO RELATED APPLICATIONS

This application is a continuation of application Ser. No. 09/957,512, filed Sep. 21, 2001 now abandoned, which is based upon and claims the benefit of priority from the prior Japanese Application No. 2000-295240, filed on Sep. 27, 2000, which is incorporated herein by reference.

BACKGROUND OF THE INVENTION

1. Field of the Invention

The present invention relates to a method of forming a pattern on the surface of a semiconductor wafer.

2. Description of the Related Art

The process of manufacturing a semiconductor device involves a number of patterning steps wherein a plurality of materials are deposited respectively as a working film (film to be worked) on a silicon wafer, the resultant deposited layers being formed into desired patterns. The patterning of the working film can be performed as follows. First of all, a photosensitive material generally called a resist is deposited on the surface of working film to form a resist film, and then, a prescribed region of the resist film is subjected to an exposure process. Thereafter, the exposed or unexposed portion of the resist film is removed by means of a development process to thereby form a resist pattern. Finally, the working film is dry-etched using the resist pattern as an etching mask.

As for the exposure light source to be employed in the exposure process, an ultraviolet ray such as a KrF excimer laser, ArF excimer laser, etc. has been employed in view of throughput. However, due to the recent trend to further miniaturize an LSI, the resolution is now required to be controlled to as fine as not more than the wavelength of the ultraviolet ray. As a result, the tolerance in the exposure process such as the exposure tolerance dose or the focusing tolerance is now becoming insufficient for meeting such a trend. It may be effective, for the purpose of making up for these process margins, to make the resist film thinner in thickness to thereby improve the resolution of the resist film. This however leads to the problem that it becomes difficult to secure a sufficient film thickness of resist layer which is required for etching the working film.

With a view to overcome this problem, a pattern transfer method is now employed, wherein a resist pattern is transferred to a silicon oxide film to form a silicon oxide film pattern, which is then employed as an etching mask in the dry-etching of a working film.

As for the silicon oxide film to be employed in this case, a spin-on glass has been employed because of the simplicity of the coating method for forming a film thereof. However, the employment of this spin-on glass is accompanied with the problem that the spin-on glass may be ruptured on the occasion of etching a working film, thereby making it difficult to properly work the working film.

BRIEF SUMMARY OF THE INVENTION

According to the present invention, there is provided a method of forming a pattern, which comprises the steps of:

forming a masking material layer on a surface of a working film by coating the surface with a solution of a mixture comprising an inorganic compound having a bond between an inorganic element and oxygen atom, and a volatile unit;

volatilizing the volatile unit to make the masking material layer porous;

forming a resist layer on a surface of the masking material layer;

subjecting the resist film to a patterning process to form a resist pattern;

dry-etching the masking material layer to thereby transfer the resist pattern to the masking material layer, thereby forming a masking material pattern; and dry etching the working film to thereby transfer the masking material pattern to the working film to thereby form a working film pattern.

Further, according to the present invention, there is also provided a method of forming a pattern, which comprises:

forming a masking material layer on a surface of working film by coating the surface with a solution of a mixture comprising an inorganic compound having a bond between an inorganic element and oxygen atom, and a soluble unit;

treating the masking material layer with a solvent which is capable of dissolving the soluble unit to thereby make the masking material layer porous;

forming a resist layer on a surface of the masking material layer;

subjecting the resist film to a patterning process to form a resist pattern;

dry-etching the masking material layer to thereby transfer the resist pattern to the masking material layer, thereby forming a masking material pattern; and dry etching the working film to thereby transfer the masking material pattern to the working film to thereby form a working film pattern.

BRIEF DESCRIPTION OF THE SEVERAL VIEWS OF THE DRAWING

FIGS. 1A to 1E are cross-sectional views illustrating in step-wise a method of forming a pattern according to one embodiment of the present invention.

DETAILED DESCRIPTION OF THE INVENTION

Figure 1D:
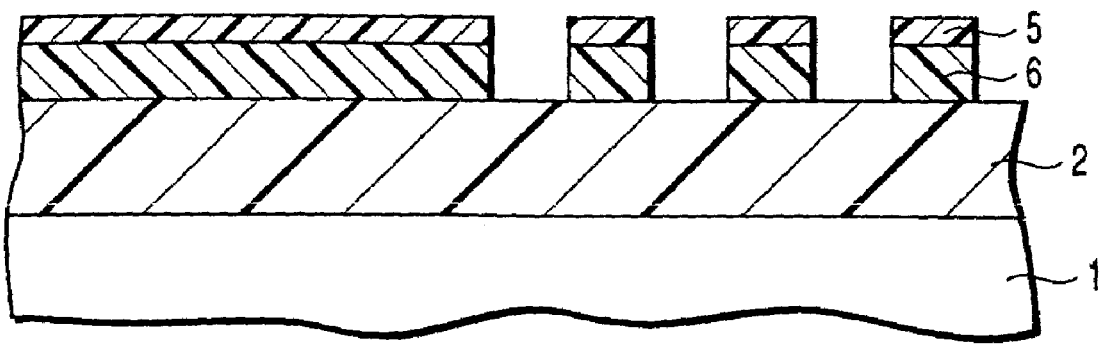

The present inventors have found out that the rupturing of a masking material pattern on the occasion of etching a working film occurs due to the accumulation of an etching gas at an interface between the masking material pattern and the working film, as the etching gas has been employed at the time of transferring the mask material pattern onto the working film.

Based on this finding, the present inventors have found out that the rupturing of the masking material pattern can be prevented by adopting a method wherein a volatile unit or a soluble unit is incorporated into a masking material layer, and then, the volatile unit or the soluble unit in the masking material layer is allowed to volatilize or dissolve using a solvent to thereby turn the masking material layer into a porous one, thus permitting the etching gas accumulated at the interface between the masking material pattern and the working film to escape through this porous masking material layer. The present invention has been accomplished on the basis of these findings.

According to a first embodiment of the present invention, a solution of a mixture comprising an inorganic compound having a bond between an inorganic element and oxygen atom, and a volatile unit is coated on the surface of a working film to form a masking material layer, and then, the volatile unit is volatilized, thereby turning the masking material layer into a porous layer.

The volatilization of the volatile unit in this case can be performed by heating the masking material layer. The temperature in this case is preferably in the range of from 100 to 500° C.

The volatilization of the volatile unit can be also performed by the irradiation of an energy beam. As for the energy beam, it is possible to employ an electron beam, ultraviolet rays, a visible light or X-rays.

As for the volatile unit to be employed in this first embodiment of the present invention, a volatile additive can be employed. As for this volatile additive, it is possible to employ a radical generating agent such as azo compounds, di-azo compounds, peroxides, alkylaryl ketone, silylperoxide or organic halides; halogen-containing compounds; orthoquinone diazide compounds; sulfone compounds, sulfonic acid compounds, or nitrobenzyl compounds.

Other preferable examples of the volatile unit are a polymer or a copolymer containing as a polymeric unit at least one kind of material selected from amine, amino acid, sulfur dioxide, acetal and halides thereof; a polymer or a copolymer containing as a polymeric unit at least one kind of material selected from cresol, styrene, acrylic acid, methacrylic acid and halides thereof; and a dye such as coumalin, curcumin, etc.

The compound having a low molecular weight is preferable as the volatile unit since, the lower the molecular weight of the compound, the more volatile or soluble the compound becomes. The molecular weight of the compound may be preferably about 3000 or less, and more preferably 1000 or less.

Further, the volatile unit may be added in a state wherein the volatile unit is chemically bonded with an inorganic compound. As for specific examples of such an inorganic compound with which the volatile unit is chemically bonded, they include those having a functional group of substituted or unsubstituted aliphatic or aromatic hydrocarbon with carbon number of 2 or more. For example, among the compounds of aforementioned formulas, compounds represented by formulas 1-10, 1-12, and 1-13 described below can be employed.

By the way, the method of turning the mask material layer into a porous layer can be also performed by enabling the volatile unit to volatilize by making use of an etchant to be employed for dry-etching the working film, other than the employment of the aforementioned heating or irradiation of an energy beam.

According to a second embodiment of the present invention, a solution of a mixture comprising an inorganic compound having a bond between an inorganic element and an oxygen atom, and a soluble unit is coated on the surface of working film to form a masking material layer, and then, the soluble unit is dissolved by making use of a solvent, thereby turning the masking material layer into a porous layer.

As for the soluble unit to be employed in this second embodiment of the present invention, a soluble additive can be employed. As for this soluble additive, it is possible to employ a radical generating agent such as azo compounds, di-azo compounds, peroxides, alkylaryl ketone, silylperoxide or organic halides; halogen-containing compounds; orthoquinone diazide compounds; sulfone compounds, sulfonic acid compounds, or nitrobenzyl compounds.

Other preferable examples of the soluble unit are a polymer or a copolymer containing as a polymeric unit at least one kind of material selected from amine, amino acid, sulfur dioxide, acetal and halides thereof; a polymer or a copolymer containing as a polymeric unit at least one kind of material selected from cresol, styrene, acrylic acid, methacrylic acid and halides thereof; and a dye such as coumalin, curcumin, etc.

The compound having a low molecular weight is preferable as the soluble unit since, the lower the molecular weight of the compound, the more volatile or soluble the compound becomes. The molecular weight of the compound may be preferably about 3000 or less, and more preferably 1000 or less.

Further, the soluble unit may be added in a state wherein the soluble unit is chemically bonded with an inorganic compound. As for the specific examples of such an inorganic compound with which the soluble unit is chemically bonded, they include those having a functional group of substituted or unsubstituted aliphatic or aromatic hydrocarbon with carbon number of 2 or more. For example, among the compounds of aforementioned formulas, compounds represented by formulas 1-10, 1-12, and 1-13 described below can be employed.

As for the solvent useful in this case, it is possible to employ a ketone-based solvent, a Cellosolve-based solvent, an ester-based solvent, an alcohol-based solvent, anisole, toluene, xylene, naphtha or water.

According to a first and a second embodiments of the present invention, the inorganic element may be silicon, and if silicon is selected, the inorganic compound may be a compound having a siloxane bond.

Further, the dry etching should preferably be performed by making use of a gas containing nitrogen. As for the specific examples of gas containing nitrogen, they include $N_2$ or $NH_3$.

According to the method of the present invention for forming a pattern, which is formulated as mentioned above, since a porous mask material layer is employed, it is possible to work a working film with excellent selectivity and mass-producibility without inviting the rupture of mask material layer.

Next, a specific embodiment of the present invention will be explained with reference to the drawings.

First of all, as shown in FIG. 1A, a working film 2 is formed on a wafer 1. As for the specific examples for this working film 2, they include, though there is not any particular limitation, a conductive material such as aluminum, aluminum silicide, copper, tungsten, tungsten silicide, titanium, titanium nitride, etc.; a semiconductor such as germanium, silicon, etc.; and an insulating material such as silicon oxide, silicon nitride, silicon oxynitride, organic resin, etc.

Especially, when the working film 2 is formed of an organic material, the mask material of the present invention can be advantageously employed, since the mask material is capable of exhibiting a high etching resistance under a condition which is suited to the etching of the organic material.

As for the organic material useful for constituting the working film 2, it is possible to employ an underlying resist or a low permittivity film, which is adapted to be employed in a multi-layer resist process. For example, it is possible to employ novolac, polyvinyl phenol, polymethacrylate, polyarylene, polyarylene ether, carbon, etc.

As for the thickness of the working film 2, though it may vary depending on the end-use, it should preferably be within the range of about 20 to 10000 nm. Because, if the film thickness is less than 20 nm, it becomes difficult to enable the working mask to exhibit its inherent properties. On the other hand, if the film thickness is larger than 10000 nm, a conversion difference in dimension is more likely to be generated on the occasion of transferring a masking material pattern onto the working mask.

Then, a masking material layer 3 is deposited on the surface of the working film 2. The thickness of the masking material layer 3 in this case should preferably be within the range of 20 to 5000 nm. Because, if the film thickness is less than 20 nm, the masking material layer 3 may be completely etched away in the middle of the etching step of the working film 2, thereby making it difficult to precisely work the working film 2 into a desired dimension. On the other hand, if the film thickness is larger than 5000 nm, a conversion difference in dimension is more likely to be generated on the occasion of transferring a resist pattern onto the masking material layer 3.

As for the method of forming the masking material layer 3, a coating method can be preferably employed. Because, the coating method is more simple in process and the process cost can be reduced as compared with the CVD method. Therefore, the method of forming a masking material layer by means of a coating method will be explained in detail hereinafter.

First of all, an inorganic compound having an inorganic atom-oxygen atom bond in the backbone chain thereof is dissolved in a solvent to prepare a masking material solution. As for the inorganic element, it is possible to employ silicon, germanium, aluminum, titanium, etc. By the way, the inorganic compound in this case may be attached on the side chain thereof with a hydrogen atom or an organic group such as a substituted or unsubstituted aliphatic hydrocarbon group or aromatic hydrocarbon group containing 1 to 20 carbon atoms.

As for such inorganic compounds, compounds having a siloxane bond are preferable. For example, the compounds having the following formulas [1-1] to [1-13] can be employed.

[1-1]
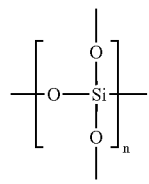

[1-2]
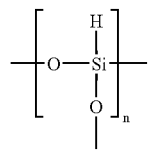

[1-3]
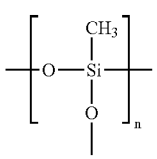

-continued

[1-4]
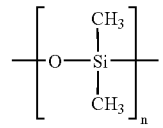

[1-5]
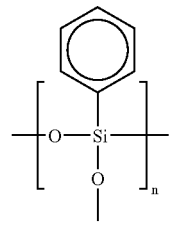

[1-6]
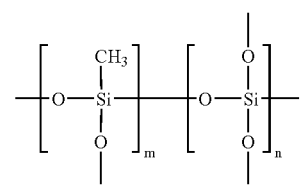

[1-7]
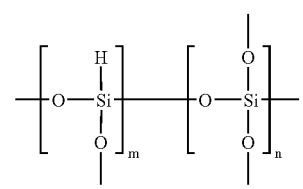

[1-8]
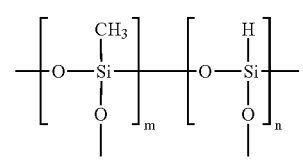

[1-9]
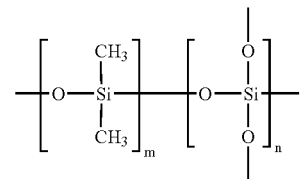

[1-10]
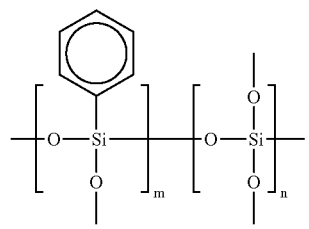

[1-11]
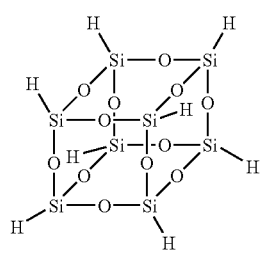

-continued

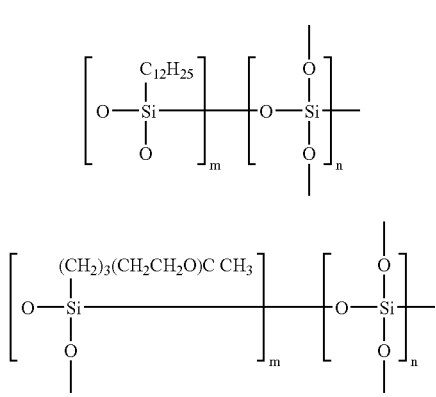

As for the molecular weight of these inorganic compounds, those having a molecular weight ranging from 200 to 100,000 are preferable, though there is not any particular limitation. Because, if the molecular weight is less than 200, the masking material may be readily dissolved in a solvent for the resist. On the other hand, if the molecular weight exceeds over 100,000, it may become difficult to dissolve the inorganic compound in the solvent, thereby making it difficult to prepare a solution of the materials desired.

A solution having an inorganic compound dissolved therein is required to contain, as an additive, a compound containing a volatile unit or a soluble unit. The mixing ratio of the additive should preferably be in the range of 0.5 to 100 parts by weight, more preferably in the range of 1 to 50 parts by weight based on 100 parts by weight of the inorganic compound. Because, if the mixing ratio of the additive is less than 0.5 parts by weight, it may become difficult to turn the masking material layer into a porous body having a sufficient porosity. On the other hand, if the mixing ratio of the additive exceeds 100 parts by weight, the etching resistance of the masking material layer on the occasion of etching the working film may be deteriorated.

As for the kind of such a compound, the following compounds can be employed, though there is not any particular limitation.

Namely, it would be possible to employ a radical generating agent such as azo compounds, di-azo compounds, peroxides, alkylaryl ketone, silylperoxide or organic halides; halogen-containing compounds; orthoquinone diazide compounds; sulfone compounds, sulfonic acid compounds, or nitrobenzyl compounds.

Other preferable examples of the volatile compound and soluble compounds are a polymer or a copolymer containing as a polymeric unit at least one kind of material selected from amine, amino acid, sulfur dioxide, acetal and halides thereof; a polymer or a copolymer containing as a polymeric unit at least one kind of material selected from cresol, styrene, acrylic acid, methacrylic acid and halides thereof; and a dye such as coumalin, curcumin, etc.

The compound having a low molecular weight is preferable since the lower the molecular weight of the compound, the more volatile or soluble the compound becomes. The molecular weight of the compound may be preferably about 3000 or less, and more preferably 1000 or less.

Instead of employing a volatile compound or a soluble compound, it is possible to employ an inorganic compound having a volatile unit or a soluble unit which is chemically bonded thereto. Examples of such an inorganic compound are those having a functional group of substituted or unsubstituted aliphatic or aromatic hydrocarbon with carbon number of 2 or more. For example, among the compounds of aforementioned formulas, compounds represented by formulas 1-10, 1-12, and 1-13 can be employed.

It is also possible, if required, to further incorporate other kinds of additives such as a thermal polymerization preventive agent for improving the storage stability, an adhesion improver for improving the adhesion of a masking material layer to a working film, an electric conductive substance, a substance which is capable of exhibiting electric conductivity through the application of light or heat, and a surfactant for improving the coating property of a masking material.

As for the solvent useful in this case, it is possible to employ a ketone-based solvent such as acetone, methylethyl ketone, methylisobutyl ketone, cyclohexanone, etc.; a cellosolve-based solvent such as methyl cellosolve, methyl cellosolve acetate, ethyl cellosolve acetate, etc.; an ester-based solvent such as ethyl lactate, ethyl acetate, butyl acetate, isoamyl acetate, etc.; an alcohol-based solvent such as methanol, ethanol, isopropanol, etc.; anisole, toluene, xylene, naphtha and water.

After a solution of masking material is prepared according to the aforementioned procedure, the solution is coated on the surface of a working film by means of a spin-coating method, and then, the coated layer is heated to vaporize the solvent, thereby forming a masking material layer 3.

As for the heating temperature in this case, it would be preferable to confine it within the range of 100 to 500° C. though there is not any particular limitation, because, if the heating temperature is lower than 100° C., it becomes impossible to easily dry out the solvent, while if the heating temperature is higher than 500° C., the working film may be denatured.

As the masking material layer is heated, the volatile unit in an additive is enabled to volatilize, thereby enhancing the porosity of the masking material layer. It may be preferable, if the degree of porosity is found insufficient, to irradiate an energy beam such as an electron beam, ultraviolet rays, a visible light or X-rays onto the masking material layer so as to promote the volatilization of the volatile unit in the additive.

The heating or the irradiation of an energy beam may be performed in an atmosphere of reduced pressure, thereby making it possible to promote the volatilization of the volatile unit in the additive.

It is also possible to turn the masking material layer into a porous body by treating the masking material layer with a solvent to thereby selectively dissolve and remove the soluble unit from the masking material layer.

As for the solvent to be employed for forming a porous masking material layer, almost any kind of solvent can be employed as long it is capable of dissolving the additive without dissolving the inorganic compound included in the masking material layer.

Specific examples of the solvent useful in this case include a ketone-based solvent such as acetone, methylethyl ketone, methylisobutyl ketone, cyclohexanone, etc.; a cellosolve-based solvent such as methyl cellosolve, methyl cellosolve acetate, ethyl cellosolve acetate, etc.; an ester-based solvent such as ethyl lactate, ethyl acetate, butyl acetate, isoamyl acetate, etc.; an alcohol-based solvent such as methanol, ethanol, isopropanol, etc.; anisole, toluene, xylene, naphtha and water.

By the way, the density of the porous masking material layer should preferably be in the range of 0.5 to 2.4 g/cm$^3$. If the density of the porous masking material layer is less than 0.5 g/cm$^3$, it would be impossible to secure a sufficient etching resistance on the occasion of etching the working film. On the other hand, if the density of the porous masking material layer is larger than 2.4 g/cm$^3$, it would become impossible to easily allow the etching gas employed in the etching of the working film to escape, thereby increasing the possibility of rupturing the masking material layer.

The refractive index of the porous masking material layer should preferably be in the range of 1.1 to 2.3 at a wavelength of 193 nm. If the refractive index of the porous masking material layer is less than 1.1, it becomes impossible to secure a sufficient etching resistance due to an excessive degree of the porosity thereof. On the other hand, if the refractive index of the porous masking material layer is larger than 2.3, the etching gas may be allowed to accumulate at an interface between the masking material layer and the working film on the occasion of etching the working film due to an insufficient degree of porosity thereof, thereby increasing the possibility of rupturing the masking material layer.

Then, as shown in FIG. 1B, a solution of a resist is coated on the surface of the masking material layer, which is followed by the heating treatment of the coated layer, thereby forming a resist film 4. The smaller the thickness of the resist film 4 is, the easier it becomes to enhance the tolerance of the exposure dose, the focusing tolerance or the resolution in the exposure step. Therefore, the thickness of the resist film 4 should preferably be as thin as possible provided that the masking material layer 3 can be etched with an excellent dimensional controllability. Therefore, the thickness of the resist film 4 should preferably be in the range of 10 to 10000 nm.

As for the kind of resist, there is not any particular limitation, and hence the resist can be suitably selected from positive or negative resists depending on the end-use thereof. Specific examples of the positive resist include a resist (IX-770, JSR Co., Ltd.) which mainly consists of naphthoquinone diazide and novolac resin, a chemical amplification type resist (APEX-E, Shipleiy Co., Ltd.) which mainly consists of t-BOC-protected polyvinylphenol resin and a photo-acid generating agent, etc.

As for the negative resist, specific examples thereof include, though are not limited thereto, a chemical amplification type resist (SNR200, Shipleiy Co., Ltd.) which mainly consists of polyvinylphenol and melamine resin, a resist (RD-2000N, Hitachi Kasei Co., Ltd.) which is mainly consisted of polyvinylphenol and bis-azide compound, etc.

A resist solution prepared in this manner is coated on the surface of masking material layer 3 by means of a spin-coating method or dipping method to form a layer, which is then heated to vaporize the solvent, thereby forming a resist film 4.

Then, the resist film 4 is subjected to a patterning exposure and then, to a development process, thereby forming a resist pattern 5 as shown in FIG. 1C. As for the exposure light source, it is possible to employ a g-line (436 nm) or i-line (365 nm) of a mercury lamp; an excimer laser such as XeF (wavelength=351 nm), XeCl (wavelength=308 nm), KrF (wavelength=248 nm), KrCl (wavelength=222 nm), ArF (wavelength=193 nm) and $F_2$ (wavelength=157 nm); X-rays, an electron beam, an ion beam, etc.

After finishing the exposure, the resist film 4 is subjected, if required, to a post exposure baking, and then subjected to a development treatment using an alkaline developing solution such as tetra-methyl ammonium hydroxide (TMAH) and choline, thereby forming a resist pattern 5.

Then, as shown in FIG. 1D, the resist pattern 5 is transferred through an etching to the masking material layer 3 to form a masking material pattern 6. As for the etching method useful in this case, a dry etching method preferably employed. For example, any kind of dry etching method can be employed as long as it is capable of performing a fine working. Specific examples thereof including a reactive ion etching, a magnetron reactive ion etching, an electron beam ion etching, an ICP etching and an ECR ion etching. As for the etching gas, a gas containing fluorine atom is preferably employed, i.e. the masking material layer 3 can be suitably worked using this etching gas containing fluorine atoms.

Figure 1E:
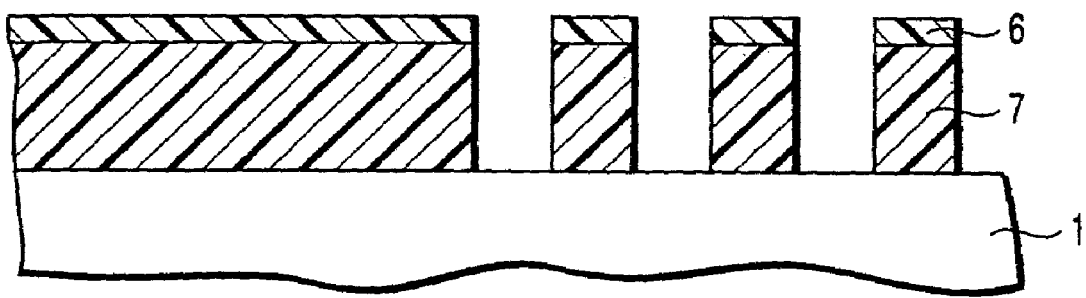
Figure 2:
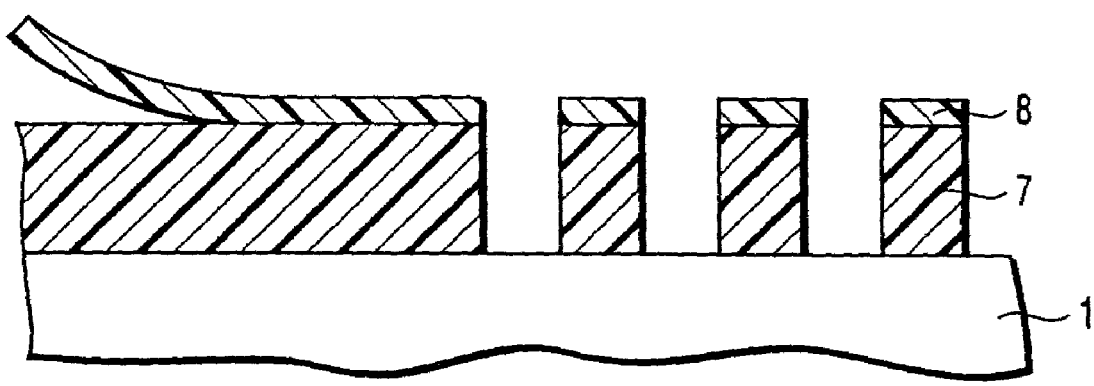
FIG. 2 is a cross-sectional view schematically illustrating the rupturing of a masking material layer in the conventional method of forming a pattern.

Then, as shown in FIG. 1E, by making use of a dry etching method, the masking material pattern 6 is transferred to the working film 2, thereby forming a working film pattern 7. As for the etching method useful in this case, any kind of dry etching method can be employed as long as it is capable of performing a fine working. Specific examples thereof including a reactive ion etching, a magnetron reactive ion etching, an electron beam ion etching, an ICP etching and an ECR ion etching.

When an organic material is employed for the working film 2, it is preferable to employ, as an etching gas, a gas containing oxygen atoms or nitrogen atoms in order to enable the etching of the working film to be performed at a high selectivity ratio relative to the masking material layer 3. Since the masking material to be employed in the present invention is inert to the etchant to be generated through the discharging of a gas containing these atoms, a high etching resistance can be achieved. As a result, the working film 2 can be worked with excellent anisotropy.

As for the etching gas containing oxygen atoms, it is possible to employ $O_2$, CO and $CO_2$. As for the etching gas containing nitrogen atoms, it is possible to employ $N_2$ and $NH_3$. These etching gases may be used as a mixture.

Since an etching gas containing nitrogen atom is deemed to induce the rupturing of the masking material layer, the present invention would be effectively applied to such a case.

Further, the etching gas may contain sulfur atoms, as this can improve the anisotropic work of the working film 2. It is also possible to incorporate other kinds of gas such as Ar or He into the etching gas.

Although it is preferable, according to the present invention, to turn the masking material layer 3 into a porous body by means of baking or energy beam irradiation after the coating of the masking material layer 3, the volatile unit in an additive may be volatilized by the etchant that has been employed on the occasion of dry-etching the working film 2, thereby turning the masking material layer 3 into a porous body. As for the preferable ranges for the density and refractive index of this porous body thus obtained, they are as explained above.

Since a porous body of masking material layer 3 is employed in the present invention, the etching gas employed in the etching of the working film 2 can be effectively prevented from accumulating at an interface between the working film 2 and the masking material layer 3. As a result, the working film 2 can be worked without inducing the rupturing of the masking material layer 3.

Next, the present invention will be further explained in detail with reference to the following example.

EXAMPLE

As shown in FIG. 1A, as a raw material for the working film 2, a solution was obtained by dissolving 10 g of polyarylene ether in 90 g of cyclohexanone, and was spin-coated on the surface of the silicon wafer 1 to form a layer, which was then baked over a hot plate for two minutes at a temperature of 350° C. to thereby form an interlayer insulating film or working film 2 having a thickness of 700 nm.

Thereafter, a masking material layer was formed on the surface of this working film 2 by a method comprising the following steps (S1) to (S8).

(S1): 9 g of silicon compound represented by the formula [1-8] (weight average molecular weight Mw=12000, copolymerization ratio m/n=1/4) and 1 g of diazonaphthoquinone were dissolved in 90 g of cyclohexanone to prepare a solution of masking material, which was then spin-coated on the surface of the working film 2. Then, the resultant layer was baked in an air atmosphere for 60 seconds at a temperature of 180° C. to thereby volatilize the solvent, which was further followed by an additional baking at a temperature of 300° C. for 120 seconds to thereby form the masking material layer 3.

(S2): 9 g of silicon compound employed in (S1) and 1 g of coumalin were dissolved in 90 g of cyclohexanone to prepare a solution of masking material, which was then employed in the same manner as in (S1) to thereby form a masking material layer.

(S3): 9 g of silicon compound employed in (S1) and 1 g of polymethylmethacrylate having an average molecular weight of 1000 were dissolved in 90 g of cyclohexanone to prepare a solution of masking material, which was then employed in the same manner as in (S1) to thereby form a masking material layer.

(S4): 9 g of silicon compound employed in (S1) and 1 g of polyvinyl alcohol having an average molecular weight of 1000 were dissolved in 90 g of cyclohexanone to prepare a solution of masking material, which was then employed in the same manner as in (S1) to thereby form a masking material layer.

(S5): After a masking material layer was formed by way of the method illustrated in (S3), cyclohexanone was dropped on the surface of this masking material layer to thereby selectively dissolve and remove the polymethacrylate contained in the masking material layer. Even though the silicon compound was permitted to proceed its cross-linking reaction enabling it to be turned into insoluble cyclohexanone as it was baked at a temperature of 300° C., the polymethacrylate was not permitted to cross-link and hence dissolved in cyclohexanone. As a result, only the polymethacrylate in the masking material layer was permitted to be selectively removed through dissolution.

(S6): 9 g of silicon compound employed in (S1) and 1 g of polyvinyl alcohol having an average molecular weight of 1000 were dissolved in 90 g of cyclohexanone to prepare a solution of masking material, which was then spin-coated on the surface of the working film. Then, the resultant layer was baked in an air atmosphere for 60 seconds at a temperature of 180° C. to thereby volatilize the solvent. Thereafter, pure water was dropped on the surface of the masking material layer to thereby selectively dissolve and remove the polyvinyl alcohol contained in the masking material layer. Then, the resultant masking material layer was further subjected to an additional baking at a temperature of 300° C. for 120 seconds. Although the silicon compound was insoluble in pure water, polyvinyl alcohol was soluble in pure water. As a result, only the polyvinyl alcohol in the masking material layer was permitted to be selectively removed through dissolution.

(S7): A solution of masking material prepared by the method shown in (S3) was baked in an air atmosphere for 60 seconds at a temperature of 180° C. to thereby volatilize the solvent. Then, the resultant layer was entirely subjected to an irradiation with a dosage of 10 C/cm² by making use of an electron beam irradiating apparatus with an accelerating voltage of 10 keV in a nitrogen gas atmosphere.

(S8): A solution of masking material prepared by the method shown in (S3) was baked in an air atmosphere for 60 seconds at a temperature of 180° C. to thereby volatilize the solvent. Then, the resultant layer was entirely subjected to an irradiation with a dosage of 20 C/cm² by making use of a flash lamp irradiating apparatus in a nitrogen gas atmosphere.

Next, as a comparative example, a masking material layer was formed by the following methods.

(R1): 10 g of silicon compound employed in (S1) was dissolved in 90 g of cyclohexanone to prepare a solution of masking material, which was then coated and baked in the same manner as in (S1) to thereby form a masking material layer.

(R2): 10 g of silicon compound employed having a formula shown in [1-3] was dissolved in 90 g of cyclohexanone to prepare a solution of masking material, which was then coated and baked in the same manner as in (S1) to thereby form a masking material layer.

The density and refractive index at a wavelength of exposure light were measured for each of the masking material layers prepared according to the aforementioned methods. The results of measurement are shown in the following Table 1. For the purpose of comparison, the density and refractive index of the coated film which was obtained through a baking at a temperature of 180° C. for 60 seconds were also measured.

It will be seen from the following Table 1 that a prominent decrease in refractive index and density were recognized after the heating at a temperature of 300° C. or after the irradiation of energy beam with respect to the masking material layers of (S1), (S2), (S7) and (S8), thereby indicating the transformation of these masking material layers into a porous body. This may be attributed to the facts that a portion of diazonaphthoquinone and of coumalin was gasified and volatilized by the effects of heat or energy beam.

It will be clear from the comparison between (S3) and (S5), or between (S4) and (S6) that the treatment with a solvent is effective in decreasing the density and refractive index, thus promoting the degree of porosity of the masking material layer.

Then, as shown in FIG. 1B, 9 g of anti-solubilizing agent represented by the following formula [2-1] (weight average molecular weight Mw=12000) and 1 g of photo-acid generating agent represented by the following formula [2-2] were dissolved in 90 g of ethyl lactate to prepare a resist, which was then spin-coated on the surface of the masking material layer 3. Then, this coated resist layer was baked over a hot plate for 90 seconds at a temperature of 140° C. to thereby form a resist film 4 having a thickness of 200 nm.

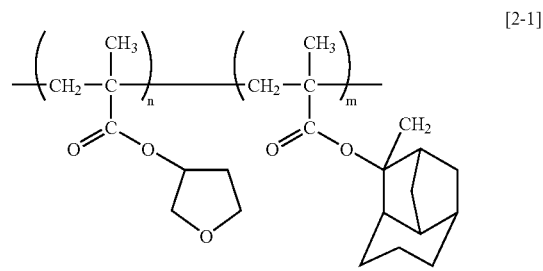

[2-1]

-continued

[2-2]

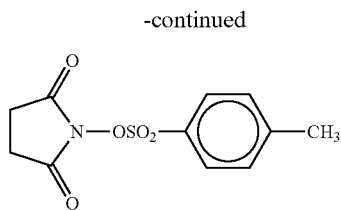

Thereafter, the resist film 4 was subjected to a patterning exposure by making use of an ArF excimer laser and then to a baking treatment for 90 seconds at a temperature of 140° C. Then, the resist film 4 was further subjected to a development process using 0.21 N tetrahydroxy ammonium hydroxide, thereby forming a resist pattern 5 of 120 nm line-and-space as shown in FIG. 1C.

Subsequently, the masking material layer 3 was subjected to an etching process using a magnetron type reactive ion etching apparatus and under the conditions of: $CF_4/O_2/Ar$=20/100/200 sccm; 75 mT in vacuum degree; 1.3 W/cm² in excitation density; and 40° C. in substrate temperature, thereby transferring the resist pattern 5 onto the masking material layer 3, thus forming a masking material layer 6. As a result, it was possible to work the masking material layer with excellent anisotropy in all examples of the masking material layer 3 as shown in FIG. 1D.

Then, as shown in FIG. 1E, the working film 2 was etched to transfer the masking material layer 6 onto the working film 2, thereby forming a working film pattern 7. The etching in this case was performed using a magnetron type reactive ion etching apparatus under the conditions of: $N_2/O_2$=20/100 sccm; 75 mT in vacuum degree; 1.3 W/cm² in excitation density; and 40° C. in substrate temperature As a result, the rupturing of the masking material layer was recognized in the masking material layers of (R1) and (R2) during the etching process of the working film. On the other hand, the rupturing of the masking material layer was not recognized in any of the masking material layers of (S1) to (S8).

The results obtained from the examination of the density and refractive index of the residual masking material layer after the etching process thereof are shown in the following Table 1. It will be seen from Table 1 that the density and refractive index were decreased even in the masking material layers of (S1) to (S8), thus indicating an increase of porosity even in the etching step of the working film. This may be attributed to the fact that the additive incorporated into the masking material or the volatile unit substituting the side chain of the silicon compound were also volatilized and gasified during the etching process.

Then, by means of XPS spectroscopy, the laminate film formed of the SOG and the working film was investigated after the etching thereof with respect to the distribution of nitrogen atoms in the thickness-wise direction while sputtering it with Ar ions. The content of nitrogen on the surface of the working film is shown in the following Table 1.

It will be seen from Table 1 that when the masking material layers of (S1) to (S8) were employed, the content of nitrogen is lower than that of the masking material layers of (R1) and (R2). Therefore, the cause for the rupturing of the masking material layer may be attributed to the fact that the etching gas that had passed through the masking material layer was allowed to accumulate at an interface between the masking material layer and the working film, thereby inviting the rupturing of the masking material layer.

Whereas, the reasons for enabling the masking material layers of (S1) to (S8) to prevent the rupturing thereof may be attributed to the fact that due to the transformation of the masking material layer into a porous body, the etching gas is prevented from accumulating at an interface between the masking material layer and the working film.

With respect to the worked configuration, each mask material layer worked had an excellent anisotropy. The results measured with respect to the etching rate of the masking material layer on the occasion of etching the working film are shown in the following Table 1. It will be recognized from Table 1 that the etching rate of the working film was 320 nm/min., that it was possible to secure 10 or more in the etching selective ratio of the working film/masking material layer. Further, it will be assumed that since the masking material layer was excellent in etching resistance, the working film was enabled to be worked with excellent anisotropy.

TABLE 1

| | Density (Refractive index) | | | Content of nitrogen (mol %) | Etching rate (nm/min) |
|---|---|---|---|---|---|
| | After baking at 180° C. | Before etching* | After etching | | |
| (S1) | 2.22(1.57) | 1.52(1.42) | 1.49(1.39) | 5 | 7 |
| (S2) | 2.32(1.58) | 1.53(1.43) | 1.52(1.41) | 6 | 7 |
| (S3) | 2.33(1.58) | 2.33(1.58) | 1.51(1.42) | 5 | 8 |
| (S4) | 2.28(1.57) | 2.21(1.57) | 1.48(1.43) | 6 | 8 |
| (S5) | 2.33(1.58) | 1.49(1.44) | 1.47(1.43) | 5 | 9 |
| (S6) | 2.28(1.57) | 1.42(1.45) | 1.38(1.42) | 6 | 9 |
| (S7) | 2.22(1.57) | 0.82(1.31) | 0.80(1.28) | 5 | 7 |
| (S8) | 2.22(1.57) | 0.83(1.32) | 0.76(1.21) | 6 | 7 |
| (R1) | 2.30(1.56) | 2.30(1.56) | 2.30(1.56) | 38 | 7 |
| (R2) | 2.28(1.56) | 2.28(1.56) | 2.28(1.56) | 37 | 7 |

*After baking at 300° C., irradiation of energy beam and treatment with solvent

As explained above in detail, since a porous masking material layer is employed according to the present invention, the working film can be worked without generating the rupturing of the masking material layer and with excellent etching selectivity and mass-producibility.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern, which comprises:
   forming a masking material layer on a surface of a working film by coating the surface with a solution of a mixture comprising an inorganic polymer having a repeating unit of a bond between an inorganic element and oxygen atom, and a soluble unit;
   treating said masking material layer with a solvent which is capable of dissolving said soluble unit to thereby make said masking material layer porous;
   forming a resist layer on a surface of said masking material layer;
   subjecting said resist film to a patterning process to form a resist pattern;
   dry-etching said masking material layer to thereby transfer said resist pattern to said masking material layer, thereby forming a masking material pattern; and
   dry etching said working film to thereby transfer said masking material pattern to said working film to thereby form a working film pattern.

2. The method according to claim 1, wherein said inorganic element is silicon.

3. The method according to claim 1, wherein said soluble unit is a soluble additive.

4. The method according to claim 3, wherein said soluble additive has an average molecular weight of 3000 or less.

5. The method according to claim 3, wherein said soluble additive is selected from the group consisting of azo compounds, di-azo compounds, peroxides, alkylaryl ketone, silylperoxide, organic halides, halogen-containing compounds, orthoquinone diazide compounds, sulfone compounds, sulfonic acid compounds, nitrobenzyl compounds, a polymer or a copolymer containing as a polymeric unit at least one of amine, amino acid, sulfur dioxide, acetal and halides thereof, a polymer or a copolymer containing as a polymeric unit at least one of cresol, styrene, acrylic acid, methacrylic acid and halides thereof, and a dye selected from one of coumalin and curcumin.

6. The method according to claim 1, wherein said soluble unit is in a state wherein it is chemically bonded with an inorganic compound.

7. The method according to claim 6, wherein said inorganic compound with which the soluble unit is chemically bonded has a functional group of substituted or unsubstituted aliphatic or aromatic hydrocarbon with carbon number of 2 or more.

8. The method according to claim 1, wherein said dry etching is performed using a gas containing nitrogen atoms.

9. The method according to claim 8, wherein said gas containing nitrogen atoms is at least one kind of gas selected from the group consisting of $N_2$ and $NH_3$.

10. The method according to claim 1, wherein said solvent is selected from the group consisting of a ketone-based solvent, a Cellosolve-based solvent, an ester-based solvent, an alcohol-based solvent, anisole, toluene, xylene, naphtha and water.

11. The method according to claim 1, wherein the dry-etching said masking material layer is performed using a gas containing fluorine atom as an etching gas.

* * * * *